United States Patent
Richey et al.

(10) Patent No.: US 7,317,774 B2
(45) Date of Patent: Jan. 8, 2008

(54) SYSTEMS AND METHODS FOR REDUCING HARMONIC INTERFERENCE EFFECTS IN ANALOG TO DIGITAL CONVERSION

(75) Inventors: Manuel F. Richey, Paola, KS (US); Jeffrey K. Hunter, Olathe, KS (US); Timothy P. Gibson, Shawnee, KS (US)

(73) Assignee: Honeywell International, Inc., Morristown, NJ (US)

( * ) Notice: Subject to any disclaimer, the term of this patent is extended or adjusted under 35 U.S.C. 154(b) by 833 days.

(21) Appl. No.: 10/365,827

(22) Filed: Feb. 13, 2003

(65) Prior Publication Data

US 2004/0161062 A1 Aug. 19, 2004

(51) Int. Cl.
H04L 7/00 (2006.01)
(52) U.S. Cl. ..................................... 375/355
(58) Field of Classification Search ................ 375/316, 375/259, 346, 355; 455/343; 370/343; 341/155, 341/159, 172; 365/185.03
See application file for complete search history.

(56) References Cited

U.S. PATENT DOCUMENTS 4,982,193 A * 1/1991 Saul ........................... 341/159
5,659,546 A * 8/1997 Elder ......................... 370/343
5,694,356 A * 12/1997 Wong et al. ............ 365/185.03
5,861,831 A 1/1999 Murden et al.
6,144,331 A * 11/2000 Jiang .......................... 341/172
6,307,497 B1 * 10/2001 Leung et al. ................ 341/155
6,337,885 B1 * 1/2002 Hellberg ..................... 375/316
6,415,001 B1 * 7/2002 Li et al. ..................... 375/259
6,639,537 B1 * 10/2003 Raz ............................ 341/155
2002/0193090 A1 * 12/2002 Sugar et al. ................ 455/343

FOREIGN PATENT DOCUMENTS

WO WO99/41851 8/1999

* cited by examiner

Primary Examiner—Don N. Vo
(74) Attorney, Agent, or Firm—Ingrassia Fisher & Lorenz

(57) ABSTRACT

Systems and methods are described for increasing the effective dynamic range of a digital data stream in a software-defined radio receiver. In one system the sample rate of an analog to digital ("A/D") conversion process is adjusted dynamically to shift harmonic signal interference induced by the A/D conversion process to outside the channels of interest. In another system the sample rate of an A/D conversion process is constant and the frequency of a dynamically controlled local oscillator in a frequency translator is adjusted dynamically to shift harmonic signal interference induced by the A/D conversion process to outside the channels of interest.

16 Claims, 10 Drawing Sheets

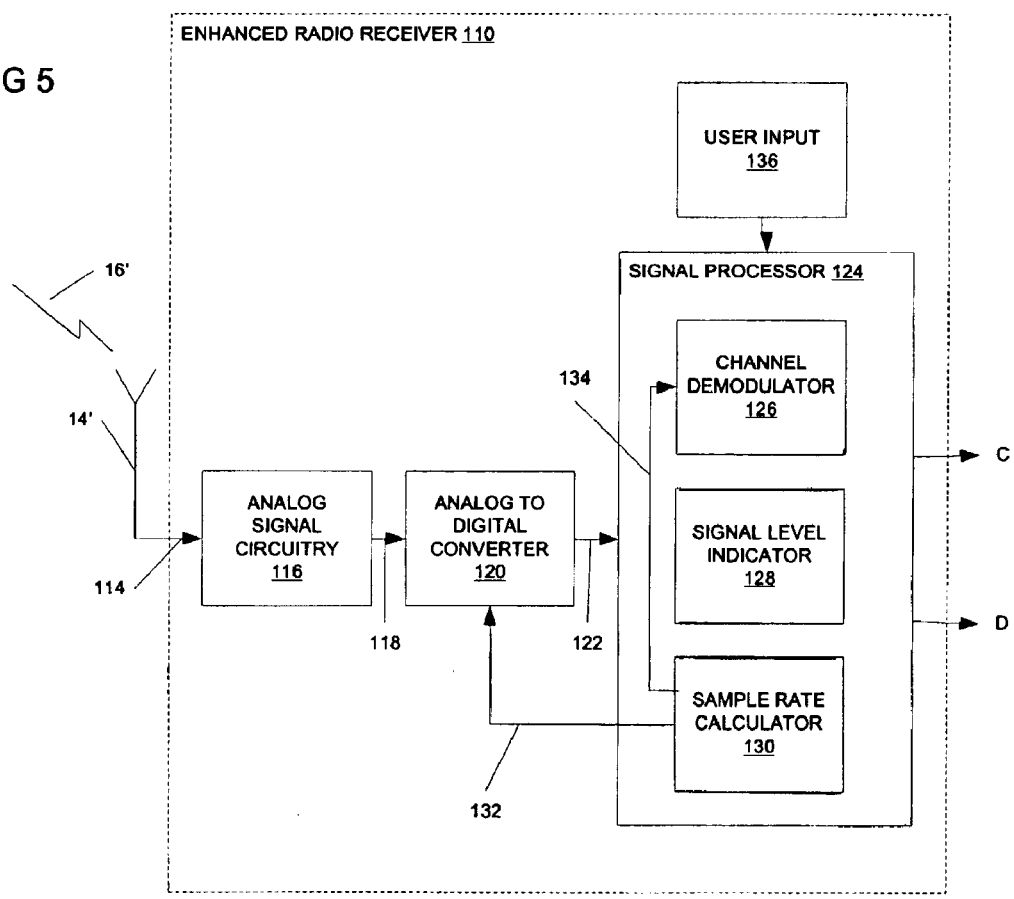

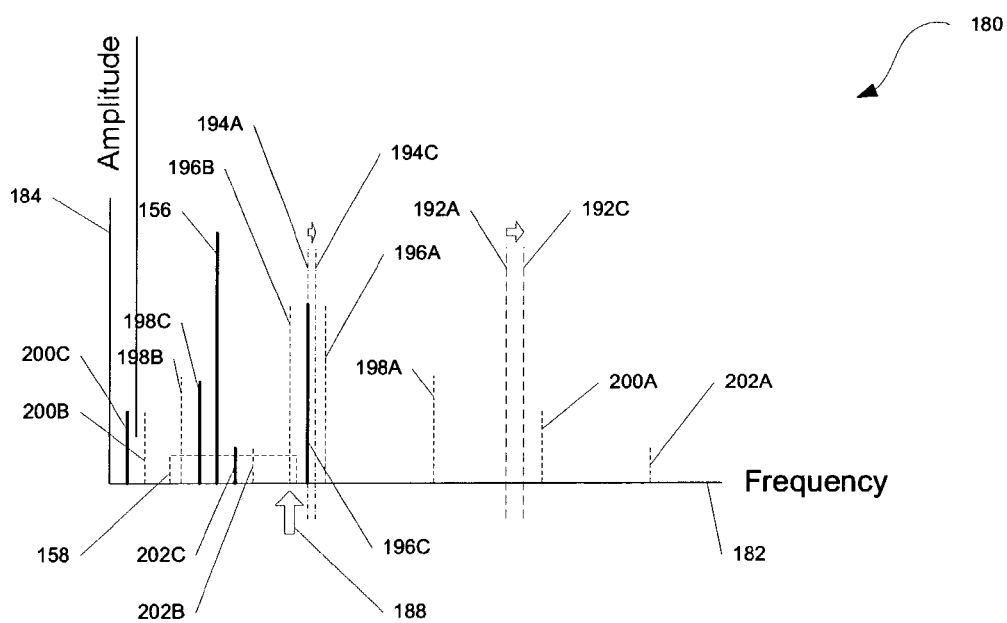

SYSTEMS AND METHODS FOR REDUCING HARMONIC INTERFERENCE EFFECTS IN ANALOG TO DIGITAL CONVERSION

BACKGROUND OF THE INVENTION

In a software-defined radio receiver, an analog-to-digital (A/D) converter is used to sample an entire operational frequency bandwidth, while only a small portion of that bandwidth is used in further processing. One example is a digital radio receiver that uses the A/D converter to sample the frequency band encompassing a plurality of channels, and a signal processor that selects an individual channel for further processing. The A/D conversion process in the radio receiver introduces harmonic spurs of strong in-band signals that reduce the effective dynamic range of a sampled digital data stream. These harmonic spurs can be up to 40 dB above a noise floor of an A/D converter. This level of harmonic interference can impair or prevent reception of weak signals in portions of the frequency band that lie close to an induced harmonic of a strong signal elsewhere within the band.

SUMMARY OF THE INVENTION

In one aspect, an enhanced radio receiver uses an A/D conversion process to convert a frequency band into a digital data stream that is then digitally processed to select one or more sub-bands of interest. The A/D conversion process uses an A/D converter to sample the frequency band at a sample rate, for example conforming to Nyquist's sampling theorem. To avoid harmonic interferences caused by the A/D conversion process, the enhanced radio receiver calculates potential signal frequencies that, if a strong signal were present, would cause harmonic interference within the sub-bands of interest for the current sample rate. The enhanced radio receiver monitors these potential frequencies and, if a strong signal is detected, changes the sample rate of the A/D conversion process such that harmonic interference frequencies do not occur within the sub-bands of interest. The enhanced radio receiver then recalculates potential signal frequencies that, if a strong signal were present, would cause harmonic interference within the sub-bands of interest at the changed sample rate.

In another aspect, the enhanced radio receiver monitors the frequency band for strong signals and calculates induced harmonic signal frequencies at the current sample rate for each detected strong signal. If the induced harmonic signal frequencies are within the sub-bands of interest, the enhanced radio receiver adjusts the sample rate to minimize or remove interference from the harmonic signals.

In another aspect, the enhanced radio receiver uses a frequency translator to translate received signals to an intermediate frequency. The enhanced receiver uses an A/D conversion process to convert an intermediate frequency band into a digital data stream that is then digitally processed to select one or more sub-bands of interest. The enhanced radio receiver has a fixed A/D sample rate and adjusts the frequency of a dynamically controlled local oscillator in a frequency translation circuit to reduce harmonic signal interference. The enhanced radio receiver calculates potential intermediate signal frequencies that, if a string signal were present, would cause harmonic interference within the sub-bands of interest. The enhanced radio receiver monitors these potential intermediate frequencies and, if detected, changes the frequency of the dynamically controlled local oscillator such that harmonic interference frequencies do not occur within the sub-bands of interest. The enhanced radio receiver then recalculates potential intermediate signal frequencies that, if a strong signal were present, would cause harmonic interference within the sub-bands of interest at the changed oscillator frequency.

In yet another aspect, the enhanced radio receiver monitors the frequency band for strong signals and calculates induced harmonic signal frequencies for the fixed A/D sample rate. If the induced harmonic signal frequencies are within the sub-bands of interest, the enhanced radio receiver adjusts the frequency of the dynamically controlled local oscillator to shift the intermediate frequencies of all received signals, such that harmonic interference frequencies do not occur within the sub-bands of interest.

BRIEF DESCRIPTION OF THE DRAWINGS

FIG. 5 is a block diagram illustrating one enhanced radio receiver.

FIG. 6 is a frequency response graph illustrating an operational bandwidth and received signal of the enhanced radio receiver of FIG. 5.

FIG. 7 is a frequency response graph illustrating signals and effects of changing sample rate to shift induced harmonic interference, by the enhanced radio receiver of FIG. 5.

DETAILED DESCRIPTION OF THE ILLUSTRATED EMBODIMENTS

Figure 1:
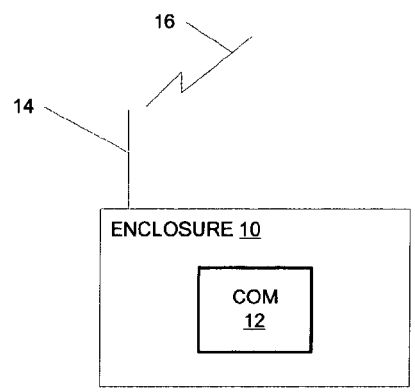
FIG. 1 is a diagram illustrating a prior art software-defined radio receiver within an enclosure.
Figure 2:
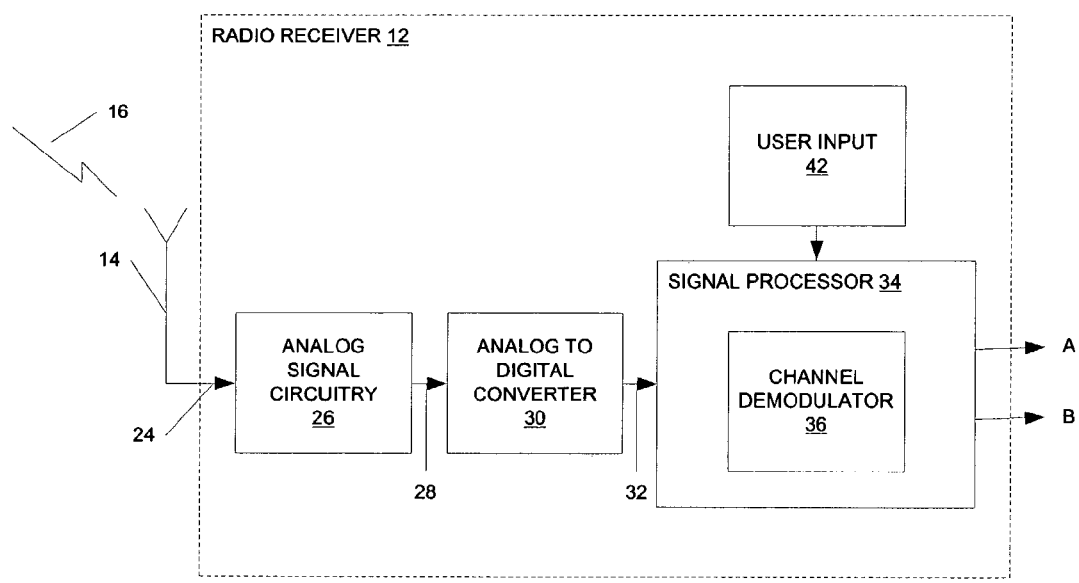
FIG. 2 is a block diagram further illustrating the software-defined radio receiver of FIG. 1.
Figure 3:
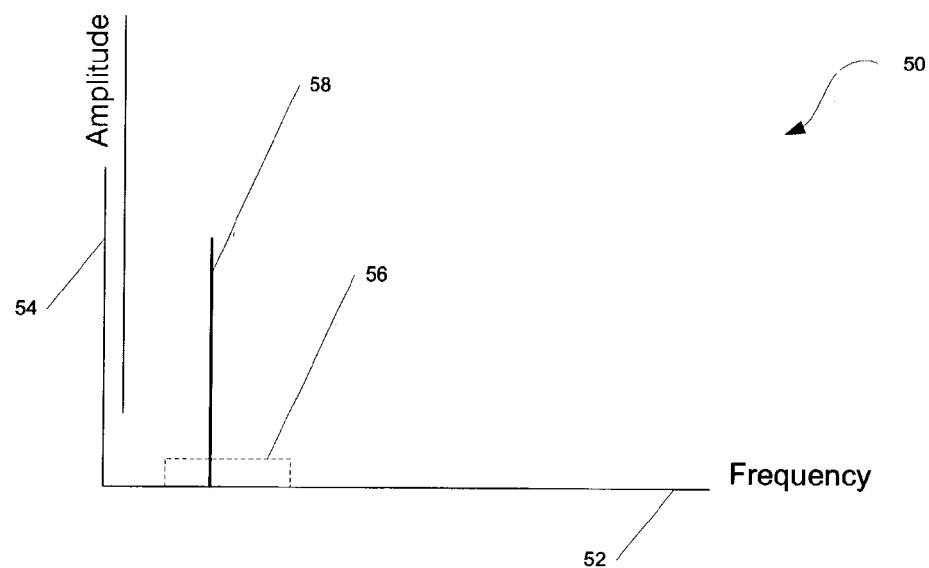
FIG. 3 is a frequency response graph illustrating an operational bandwidth and received signal of the software-defined radio of FIG. 1.
Figure 4:
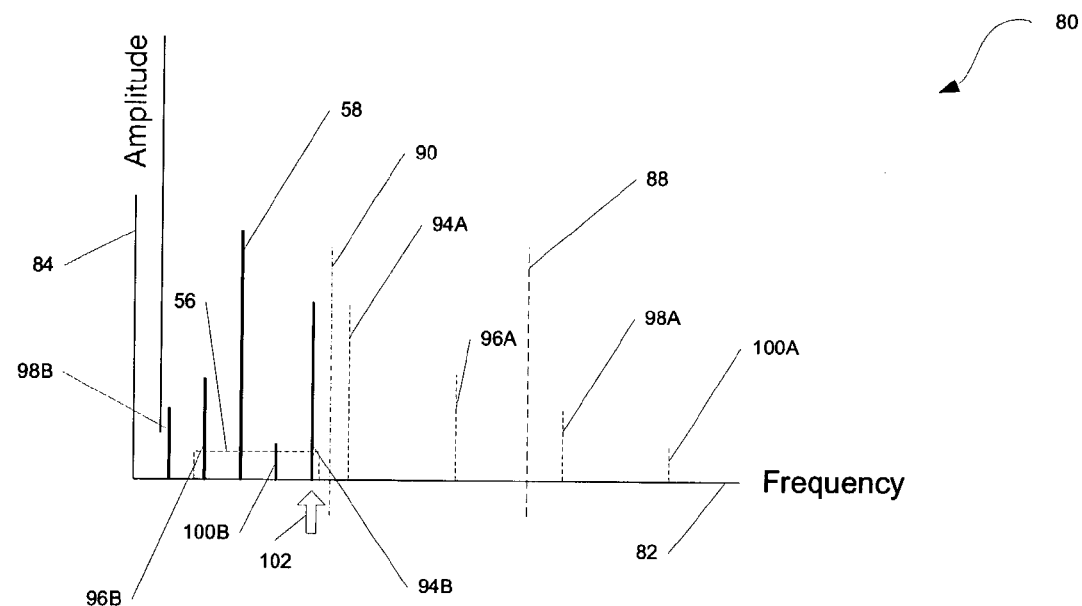
FIG. 4 is a frequency response graph illustrating signals and induced harmonics due to A/D conversion, for the prior art software-defined radio of FIG. 1.

FIG. 1 illustrates an enclosure 10 fitted with a prior art radio receiver 12. Enclosure 10 may represent a vehicle such as a plane or car, or a package or housing carried by an individual, for example. Radio receiver 12 may be a voice communication radio, for example. Radio receiver 12 uses antenna 14 to receive a radio signal 16. FIGS. 2 through 4 illustrate the limitations in the prior art radio receiver 12 of FIG. 1.

FIG. 2 is a block diagram of radio receiver 12 of FIG. 1. Antenna 14 converts radio signal 16 into signal 24. Analog signal circuitry 26 has signal filtering and conditioning typical for radio receiver 12 to produce signal 28. For example, analog signal circuitry 26 may contain a band-pass filter for attenuating signals outside an operational frequency band of radio receiver 12 and a frequency translation circuit to convert received signals to an intermediate frequency ("IF") band. Illustratively, signal 28 contains a strong signal 58 as shown in FIG. 3. A/D converter 30 samples signal 28 at a fixed sample rate, producing digital data stream 32. Signal processor 34 processes digital data stream 32, using channel demodulator 36, to produce two outputs, A and B. User input 42 selects sub-bands of the operational frequency band of digital data stream 32, called channels, for demodulation and output as outputs A and B. These channels are non-overlapping divisions of the operational frequency band.

Conversion of signal 28 to digital data stream 32 by A/D converter 30 induces harmonic signals to digital data stream 32. In radio receiver 12, where multiple channels are received simultaneously, induced harmonic signals from strong signal 58 within the operational frequency band may block or interfere with a weak signal in the operational frequency band. FIGS. 3 and 4 further explain this problem.

FIG. 3 shows a frequency response graph 50 with x-axis 52 representing frequency, and y-axis 54 representing signal amplitude. Graph 50 shows frequency content of analog signal 28 prior to A/D conversion by converter 30. Signal 58 represents the strong signal received on one channel within operational frequency band 56 of radio receiver 12.

FIG. 4 shows a frequency response graph 80 with x-axis 82 representing frequency, and y-axis 84 representing signal amplitude. Graph 80 shows the frequency content of digital data stream 32 after A/D conversion by converter 30. Graph 80 is shown in the same scale as graph 50 of FIG. 3. Nyquist's sampling theorem states that a sampling frequency must be at least twice the frequency of the highest frequency component of the signal being sampled to prevent information loss and/or aliasing. Graph 80 shows sampling frequency 88 at a frequency more than twice that of the upper frequency of frequency band 56. A Nyquist frequency 90 occurs at a frequency half that of sampling frequency 88. Any frequency component of the sampled signal that is higher than Nyquist frequency 90 is 'folded' back down the frequency scale. For example, a signal with a frequency 500 Hz higher than Nyquist frequency 90 in the A/D conversion process of converter 30 would appear at a frequency 500 Hz lower than the Nyquist frequency in digital data stream 32. Signals 94A, 96A, 98A and 100A represent the induced $2^{nd}$, $3^{rd}$ $4^{th}$ and $5^{th}$ harmonic signals, respectively, of signal 58, and are shown at frequencies before the Nyquist frequency. Harmonic signals 94A, 96A, 98A and 100A are shown exaggerated in amplitude, as compared to actual induced harmonic signals from the A/D conversion process of converter 30, for purposes of illustration. Signals 94B, 96B, 98B and 100B represent the $2^{nd}$, $3^{rd}$, $4^{th}$ and $5^{th}$ harmonic signals after folding as each appears in digital data stream 32. For this example, arrow 102 indicates a channel of interest within frequency band 56; as illustrated, the second harmonic signal 94B interferes with this channel.

FIG. 5 is a block diagram showing an enhanced radio receiver 110. Antenna 14' converts a radio wave 16' to signal 114. Enhanced radio receiver 110 has an operational frequency band 158, FIG. 6, that contains a plurality of channels. The channels are non-overlapping sub-bands of operational frequency band 158. Analog signal circuitry 116 of enhanced radio receiver 110 has filtering and conditioning to produce signal 118. For example, analog signal circuitry 116 may contain a band-pass filter for attenuating signals outside operational frequency band 158, and a frequency translation circuit to convert received signals to an IF band. Signal 118 may contain a strong signal 156 within operational frequency band 158, as shown in FIG. 6. A/D converter 120 samples signal 118 at a sample rate defined by sample rate calculator 130 of signal processor 124, via data path 132. Signal 118 is converted to digital data stream 122 by A/D converter 120. Signal processor 124 processes digital data stream 122 using channel demodulator 126 to produce a plurality of outputs, C and D. User input 136 may be used to select channels for demodulation and output as outputs C, D. Signal level indicator 128 monitors frequencies in digital data stream 122 and informs sample rate calculator 130 of respective signal strengths of these frequencies. Sample rate calculator 130 determines if strong signal 156 in digital data stream 122 generates a harmonic signal that interferes with a frequency selected for output, and, if necessary, adjusts the sample rate of A/D converter 120 via data path 132. Sample rate calculator 130 informs channel demodulator 126 of the new sampling frequency via data path 134. Channel demodulation calculations by channel demodulator 126 are based on the sample rate of A/D converter 120, and are adjusted by sample rate calculator 130 when the sample rate changes.

FIG. 6 shows a frequency response graph 150 with x-axis 152 representing frequency, and y-axis 154 representing signal amplitude. Graph 150 shows frequency content of analog signal 118 prior to A/D conversion by A/D converter 120. Signal 156 represents the strong signal within operational frequency band 158 of enhanced radio receiver 110 of FIG. 5.

FIG. 7 shows frequency response graph 180 with x-axis 182, representing frequency, and y-axis 184, representing signal amplitude. Graph 180 shows frequency components present after signal 118 is converted into digital data stream 122. Graph 180 is shown in the same scale as graph 150 of FIG. 6. Arrow 188 illustratively indicates a channel of interest.

Sample frequency 192A has Nyquist frequency 194A. Signals 196A, 198A, 200A and 202A represent $2^{nd}$, $3^{rd}$, $4^{th}$ and $5^{th}$ harmonics, respectively, of signal 156 and are shown at true frequencies before folding. Signals 196B, 198B, 200B and 202B represent signals 196A, 198A, 200A and 202A, respectively, after folding at Nyquist frequency 194A. Signal 196B, representing the folded position of the $2^{nd}$ harmonic of signal 156, interferes with the channel of interest (arrow 188). Sample frequency 192C represents a sample frequency chosen to shift harmonic signals away from the channel of interest (arrow 188). Nyquist frequency 194C corresponds to sample frequency 192C. As a result of shifted sample frequency 192C and Nyquist frequency 194C, induced harmonic signals 196A, 198A, 200A and 202A appear as signals 196C, 198C, 200C and 202C, respectively, in digital data stream 122. The induced $2^{nd}$ harmonic signal 196C, after folding at Nyquist frequency 194C, is shifted away from the channel of interest (arrow 188).

As appreciated by those skilled in the art, harmonic signal frequencies of strong signal 156 in frequency band 158 as a result of the A/D conversion process of A/D converter 120 are calculated for a given sample rate. Thus, receiver 110 operates with a sample rate such that interference from strong signal 156 is minimized or removed, effectively increasing the dynamic range of digital data stream 122.

Figure 8:
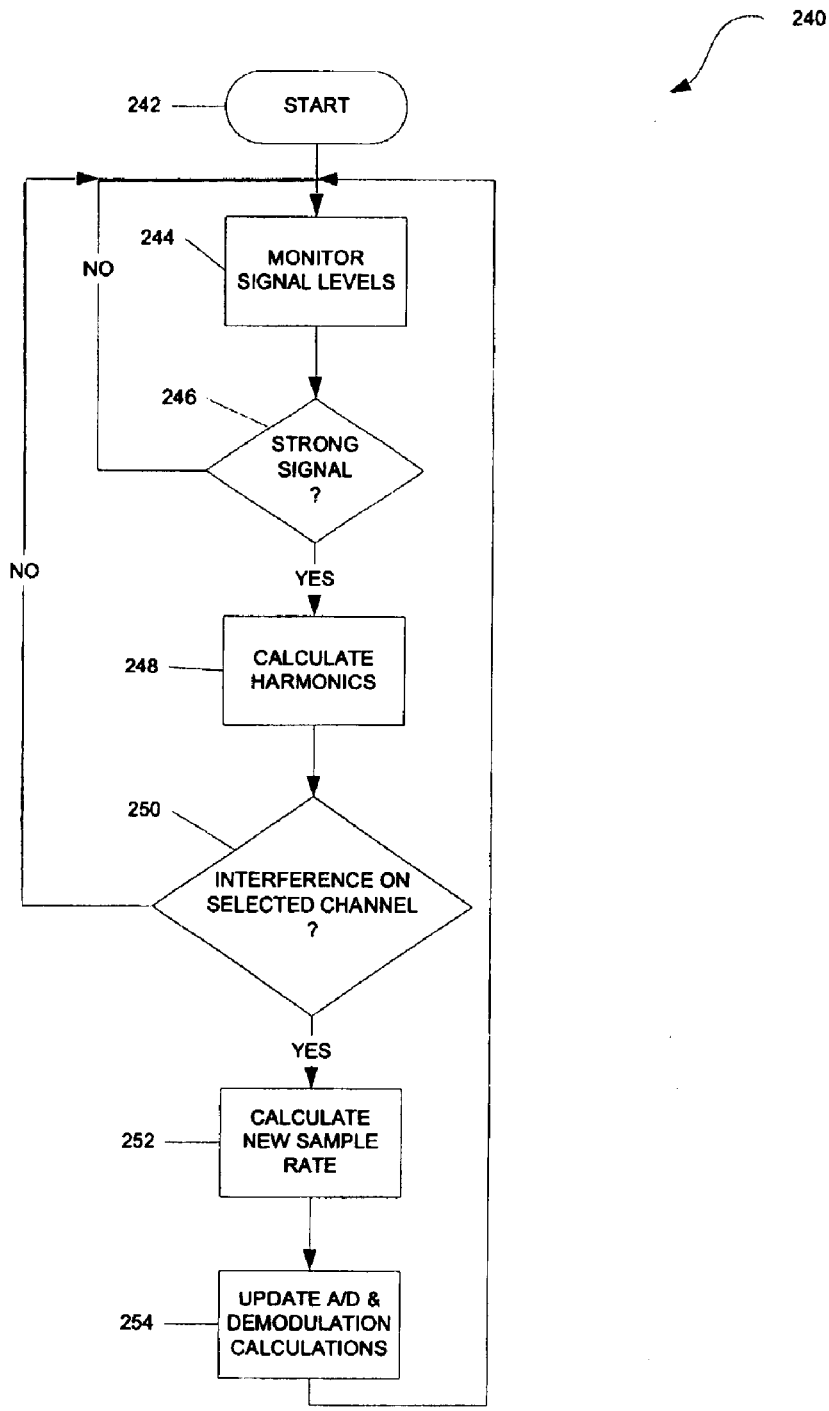
FIG. 8 is a flowchart illustrating one process for adjusting a sampling frequency in the enhanced radio receiver of FIG. 5.

FIG. 8 shows a flowchart illustrating one process 240 for controlling an enhanced radio receiver (e.g., receiver 110) to dynamically modify the sample rate of the A/D conversion process when harmonic signal interference from a strong signal in the frequency band is predicted. Process 240 starts at step 242, and continues with step 244.

Step 244 monitors frequency signal levels in the operational frequency band, e.g., frequency band 158. Process 240 continues with step 246.

Step 246 is a decision. If a strong signal is detected by step 244, process 240 continues with step 248; otherwise process 240 continues with step 244.

Step 248 calculates induced harmonic frequencies for the strong signal(s) detected in step 244. Process 240 continues with step 250.

Step 250 is a decision. If a harmonic frequency calculated in step 248 coincides with the frequency of a channel selected by a user, process 240 continues with step 252; otherwise process 240 continues with step 244.

Step 252 calculates a new sample rate for the A/D conversion process (e.g., within A/D converter 120) such that harmonics from strong signals present in the digital data stream (e.g., digital data stream 122) do not interfere with channels selected for output by a user. Process 240 continues with step 254.

Step 254 sets the sample rate of the A/D conversion process to the new sample rate calculated in step 252, and updates channel demodulation calculations of a channel demodulator (e.g., channel demodulator 126) with the new sample rate. Process 240 continues with step 244.

Figure 9:
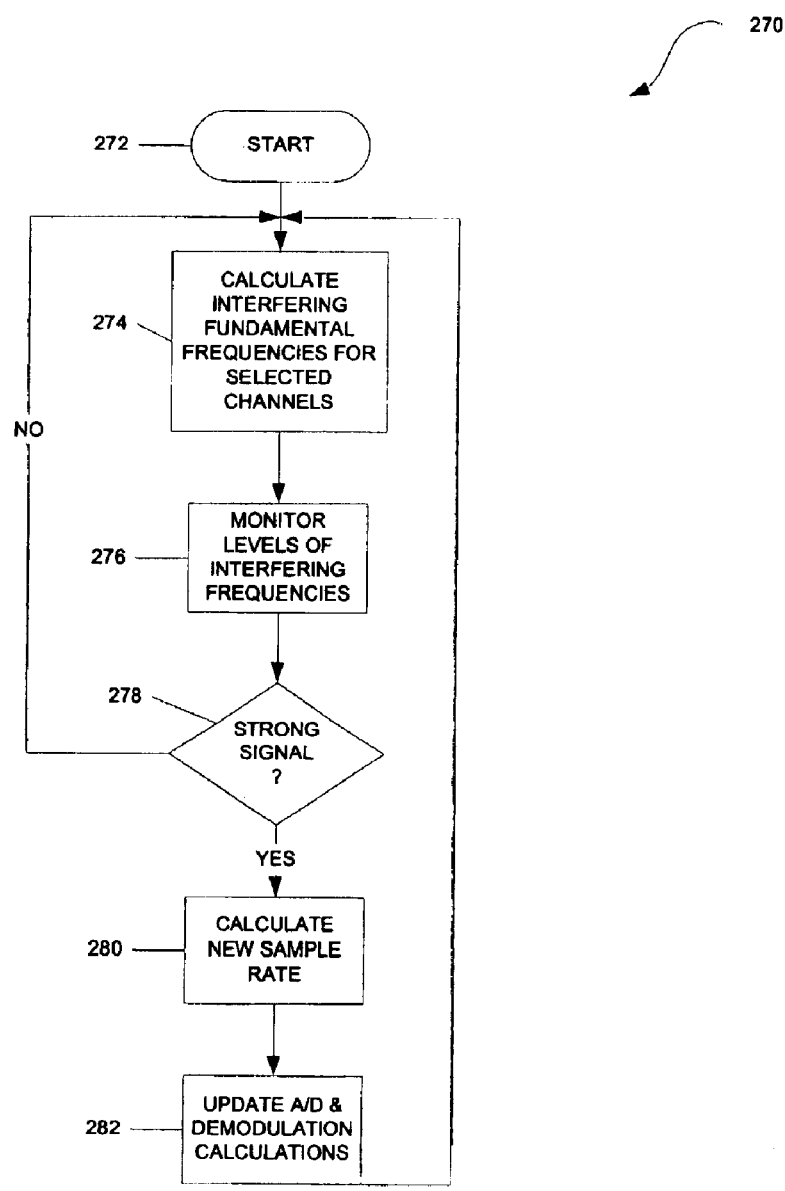
FIG. 9 is a flowchart illustrating one process for adjusting a sampling frequency in the enhanced radio receiver of FIG. 5.

FIG. 9 shows a flowchart illustrating one process 270 for controlling enhanced radio receiver 110 to dynamically modify the sample rate of the A/D conversion process of A/D converter 120 when harmonic signal interference from strong signal 156 in operational frequency band 158 of enhanced radio receiver 110 occurs. Process 270 starts at step 272, and continues with step 274.

Step 274 determines all fundamental frequencies that could cause interfering harmonics for user selected channels. Process 270 continues with step 276.

Step 276 measures signal levels for frequencies identified in step 274 for each strong signal 156 that would cause harmonic interference. Process 270 continues with step 278.

Step 278 is a decision. If a strong signal is detected by step 276, process 270 continues with step 280; otherwise process 270 continues with step 274.

Step 280 calculates a new sample rate such that strong signal 156 does not interfere with user-selected channels. Process 270 continues with step 282.

Step 282 updates A/D converter 120 and channel demodulator 126 with the new sample rate. Process 270 continues with step 274.

Processes 240 and 270 provide two methods for dynamically changing the sample rate of the A/D conversion process of converter 120 when strong signals received by enhanced radio receiver 110 interfere with weaker signals on user-selected channels of interest.

Figure 10:
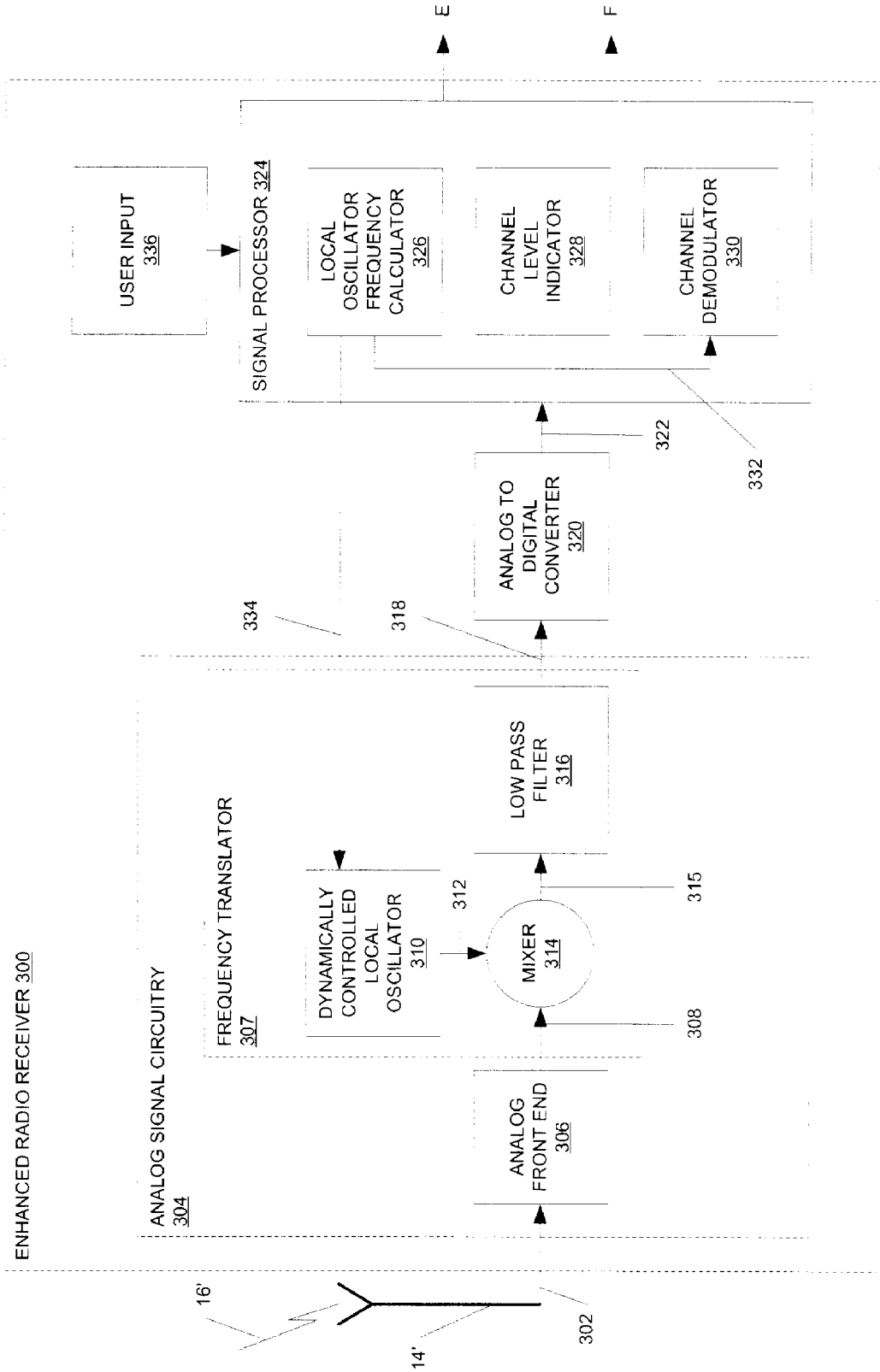
FIG. 10 is a block diagram illustrating another enhanced radio receiver.
Figure 11:
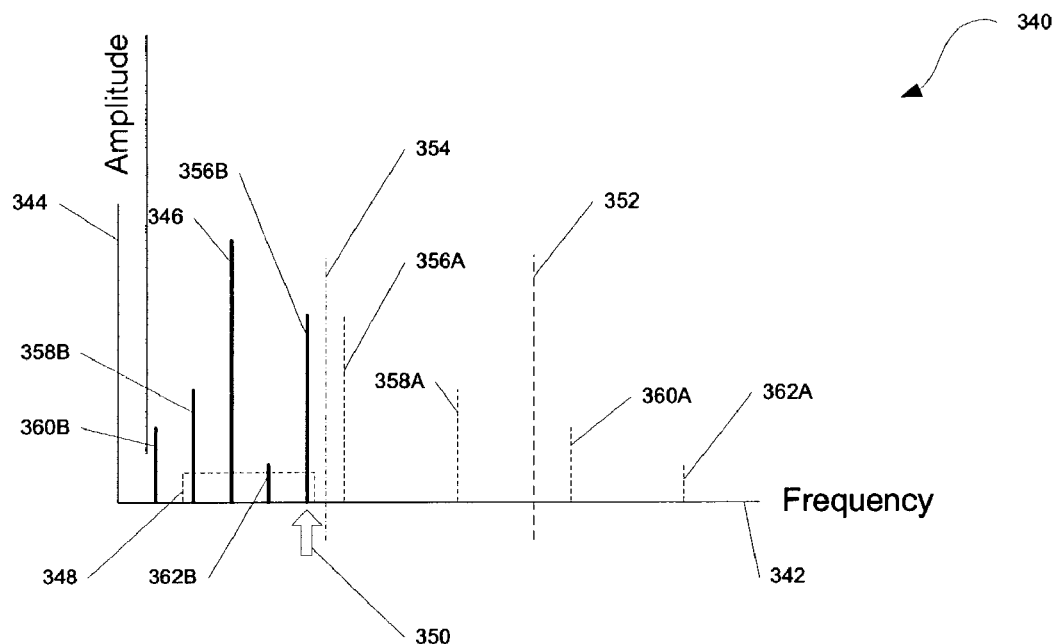
FIG. 11 is a frequency response graph illustrating an intermediate frequency bandwidth, an example intermediate frequency signal, and induced harmonic signals, as operated by the enhanced radio receiver of FIG. 10.

FIG. 10 is a block diagram illustrating one enhanced radio receiver 300. Antenna 14' converts a radio wave 16' to signal 302. Enhanced radio receiver 300 has an operational frequency band that contains a plurality of channels. The channels are non-overlapping sub-bands of the operational frequency band. Analog signal circuitry 304 of enhanced radio receiver 300 consists of an analog front end 306 and a frequency translator 307. Analog front end 306 contains filtering and conditioning circuitry to produce signal 308, and may contain a band-pass filter for attenuating signals outside the operational frequency band. Frequency translator 307 translates the operational frequency band to an intermediate frequency band 348, FIG. 11. Frequency translator 307 has a dynamically controlled local oscillator 310, mixer 314 and low pass filter 316. Frequency translator 307 translates signal 308 into signal 318 by combining signal 308 with signal 312 to produce signal 315. Signal 315 is filtered by low pass filter 316, producing signal 318. Signal 318 may contain a strong signal 346 within the intermediate frequency band 348, as shown in FIG. 11. A/D converter 320 samples signal 318 at a fixed sample rate. Signal 318 is converted to a digital data stream 322 by A/D converter 320. Signal processor 324 processes digital data stream 322 using a channel demodulator 330 to produce a plurality of outputs, E and F. User input 336 may be used to select channels for demodulation and output as outputs E, F. A channel level indicator 328 monitors frequencies in digital data stream 322 and informs local oscillator frequency calculator 326 of the signal strengths of these frequencies. Local oscillator frequency calculator 326 determines if strong signal 346 in data stream 322 generates a harmonic signal that interferes with a channel selected for output, and, if necessary, calculates a new oscillator frequency and adjusts the frequency of dynamically controlled local oscillator 310 via data path 334. Local oscillator frequency calculator 326 informs channel demodulator 330 of the new oscillator frequency via data path 332. Channel demodulation calculations by channel demodulator 330 are based on the frequency translation by frequency translator 307, and are adjusted by local oscillator frequency calculator 326 when the frequency of dynamically controlled local oscillator 310 is changed.

FIG. 11 shows frequency response graph 340 with x-axis 342 representing frequency, and y-axis 344 representing signal amplitude. Graph 340 shows frequency components present after signal 318 is converted into digital data stream 322. Arrow 350 indicates a channel of interest.

Sample frequency 352 has a Nyquist frequency 354. Signals 356A, 358A, 360A and 362A represent $2^{nd}$, $3^{rd}$, $4^{th}$ and $5^{th}$ harmonics, respectively, of strong signal 346 and are shown at true frequencies before folding. Signals 356B, 358B, 360B and 362B represent signals 356A, 358A, 360A and 362A, respectively, after folding at Nyquist frequency 354. Signal 356B, representing the folded position of the $2^{nd}$ harmonic of signal 346, interferes with the channel of interest (arrow 350).

Figure 12:
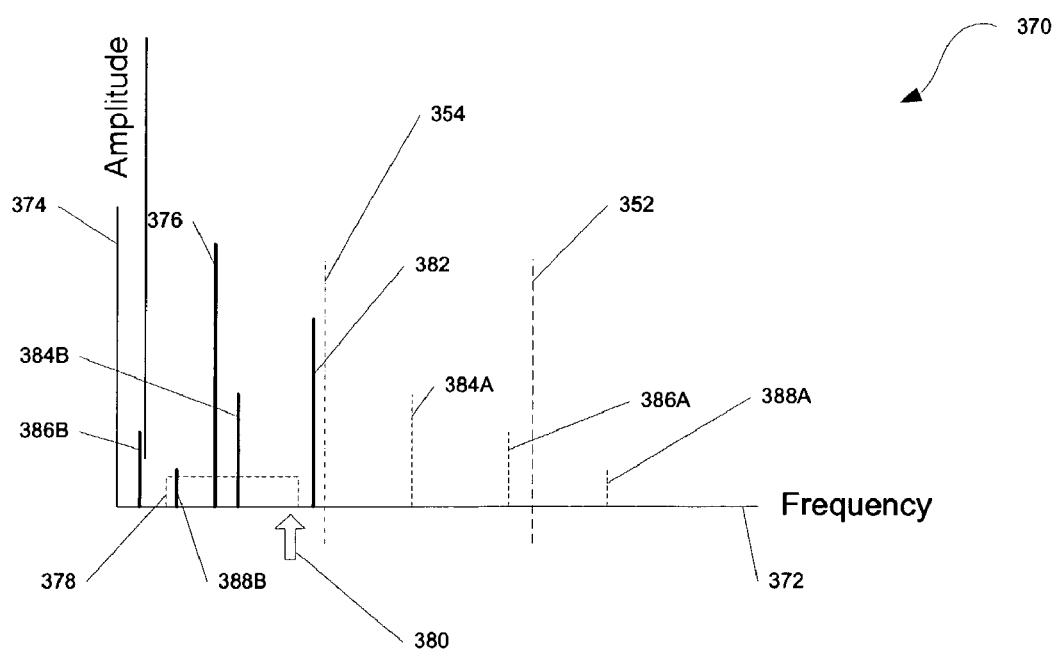
FIG. 12 is a frequency response graph illustrating signals and effects of changing dynamically controlled local oscillator frequency to shift induced harmonic signals, by the enhanced radio receiver of FIG. 10.

FIG. 12 shows frequency response graph 370 illustrating the frequency components present in digital data stream 322 after local oscillator frequency calculator 326 has adjusted the frequency of dynamically controlled local oscillator 310 to reduce harmonic interference in the channel of interest, indicated by arrow 380. In frequency response graph 370, x-axis 372 represents frequency and y-axis 374 represents signal amplitude.

When the frequency of oscillator 310 is changed, the frequency components in signal 318 are shifted; hence intermediate frequency band 348, FIG. 11, is represented by intermediate frequency band 378 after the frequency change of oscillator 310. Frequency calculator 326 also updates channel demodulator 330 when it changes the frequency of oscillator 310, as channel frequencies are also shifted. Arrow 380 indicates the same channel of interest as arrow 350, FIG. 11 after the frequency shift. Strong signal 346, FIG. 11, is shown as strong signal 376 after the frequency shift, and appears in the same channel as signal 346. Harmonic signals

382, 384A, 386A and 388A represent the $2^{nd}$, $3^{rd}$, $4^{th}$ and $5^{th}$ harmonics of strong signal 376, respectively, and are shown at true frequencies. Sample frequency 352 and Nyquist frequency 354 remain unchanged. Induced harmonic signals 384A, 386A and 388A appear as signals 384B, 386B and 388B, respectively, in digital data stream 322 after folding at Nyquist frequency 354. The induced $2^{nd}$ harmonic signal 382 is not folded as it occurs at a frequency lower than Nyquist frequency 354 in this example. However, signal 382 no longer interferes with the channel of interest (arrow 380).

As appreciated by those skilled in the art, harmonic signal frequencies of strong signal 376 in frequency band 378 resulting from the A/D conversion process of A/D converter 320 are calculated for a given frequency of dynamically controlled local oscillator 310. Thus, enhanced radio receiver 300 operates with a dynamically controlled local oscillator frequency such that interference from strong signal 376 in intermediate frequency band 378 is minimized or removed, effectively increasing the spurious free dynamic range of digital data stream 322.

Figure 13:
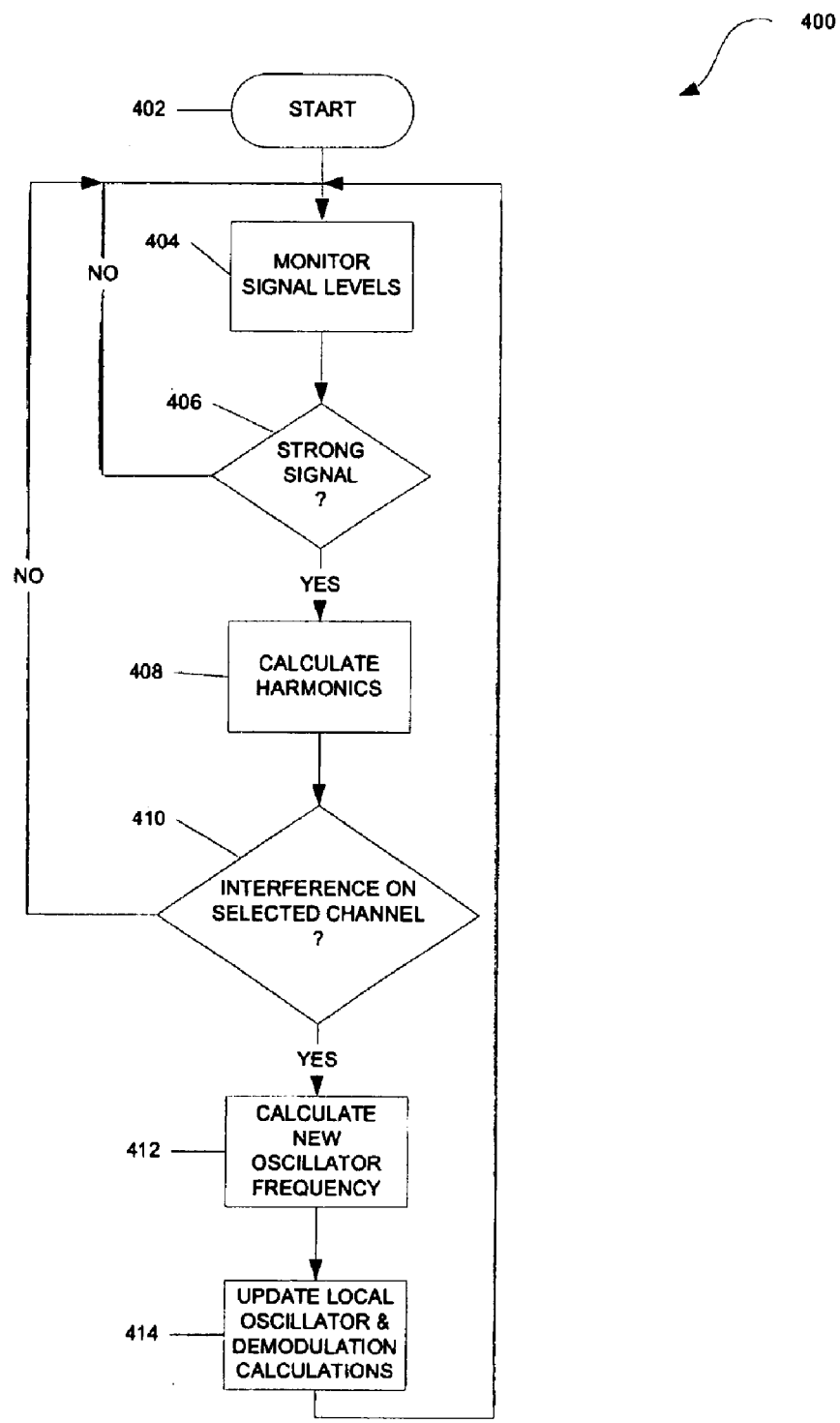
FIG. 13 is a flow chart illustrating one process for adjusting a dynamically controlled local oscillator frequency in the enhanced radio receiver of FIG. 10.

FIG. 13 shows a flowchart illustrating one process 400 for controlling enhanced radio receiver 300 to dynamically modify the frequency of dynamically controlled local oscillator 310 of frequency translator 307 when harmonic signal interference from strong signal 346 in intermediate frequency band 348 is predicted. Process 400 starts at step 402, and continues with step 404.

Step 404 monitors signal levels in intermediate frequency band 348. Process 400 continues with step 406.

Step 406 is a decision. If strong signal 346 is detected by step 404, process 400 continues with step 408; otherwise process 400 continues with step 404.

Step 408 calculates induced harmonic frequencies for strong signal(s) detected in step 404. Process 400 continues with step 410.

Step 410 is a decision. If a harmonic frequency calculated in step 408 coincides with the frequency of a channel selected by a user, process 400 continues with step 412; otherwise process 400 continues with step 404.

Step 412 calculates a new oscillator frequency for frequency translator 307 such that harmonics from strong signals present in digital data stream 322 do not interfere with channels selected for output by a user. Process 400 continues with step 414.

Step 414 sets the oscillator frequency of the frequency translation process to the new frequency calculated in step 412, and updates channel demodulation calculations of channel demodulator 330 with the new frequency. Process 400 continues with step 404.

Figure 14:
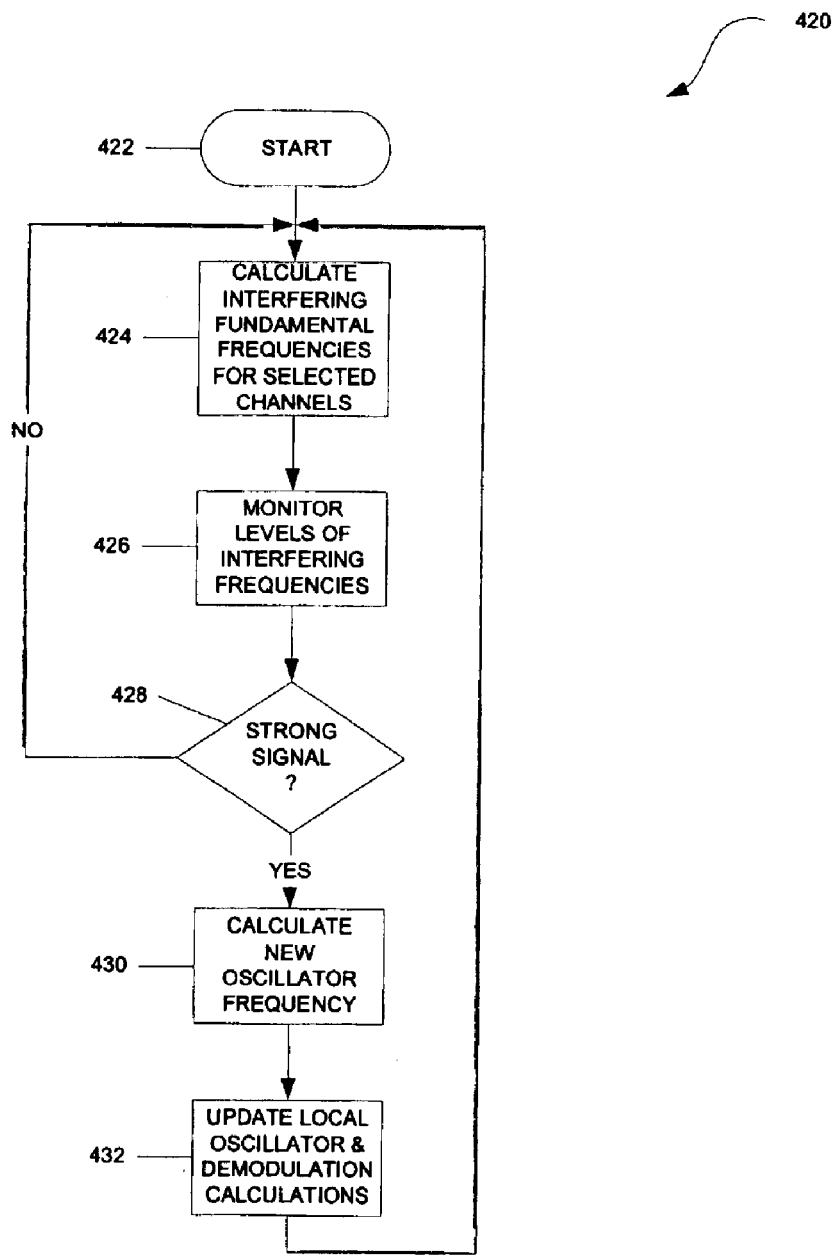
FIG. 14 is a flow chart illustrating one process for adjusting a dynamically controlled local oscillator frequency in the enhanced radio receiver of FIG. 10.

FIG. 14 shows a flowchart illustrating one process 420 for controlling enhanced radio receiver 300 to dynamically modify the oscillator frequency of dynamically controlled local oscillator 310 of frequency translator 307 when harmonic signal interference from strong signal 346 in intermediate frequency band 348 occurs. Process 420 starts at step 422, and continues with step 424.

Step 424 identifies potential frequencies that may, if a strong signal were present, cause harmonic interference to a user selected channel. Process 420 continues with step 426.

Step 426 measures signal levels for frequencies identified in step 424. Process 420 continues with step 428.

Step 428 is a decision. If a strong signal is detected by step 426, process 420 continues with step 430; otherwise process 420 continues with step 424.

Step 430 calculates a new frequency for dynamically controlled local oscillator 310 such that the strong signal(s) identified in step 428 do not interfere with user-selected channels. Process 420 continues with step 432.

Step 432 updates dynamically controlled local oscillator 310 and channel demodulator 330 with the new frequency calculated in step 430. Process 420 continues with step 424.

Processes 400 and 420 provide two methods for dynamically changing the frequency of dynamically controlled local oscillator 310 of frequency translator 307 when strong signals, (e.g. strong signal 346, FIG. 11), received by enhanced radio receiver 300 interfere with weaker signals on user-selected channels of interest.

Although the description above contains many specificities, these should not be construed as limiting the scope hereof but as merely providing illustrations of some of the embodiments. Thus the scope should be determined by the appended claims and their legal equivalents, rather than by the examples given

What is claimed is:

1. An enhanced radio receiver system for reducing harmonic interference effects induced by analog-to-digital (A/D) conversion within one or more selected channels, comprising:
   an A/D converter having a dynamically controllable sample rate, the A/D converter operable to generate a digital data stream by sampling analog signals in a frequency band at the dynamically controllable sample rate to maintain the Nyquist criterion; and
   a signal processor for processing the digital data stream to control the sample rate of the A/D converter such that harmonics of a signal within the frequency band are outside the selected channels.

2. An enhanced radio receiver system of claim 1, wherein the signal processor comprises a channel demodulator for decoding the channels within the frequency band.

3. An enhanced radio receiver system of claim 2, wherein the signal processor comprises a signal level indicator for determining signal strengths in the frequency band.

4. An enhanced radio receiver system of claim 2, wherein the signal processor comprises a sample rate calculator for selecting the sample rate by feedback with the A/D converter.

5. An enhanced radio receiver system of claim 1, further comprising means for inputting the selected channels to the signal processor.

6. An enhanced radio receiver system of claim 1, further comprising analog signal circuitry for selecting the frequency band from radio signals input to the enhanced radio receiver system.

7. A method for reducing harmonic interference effects within one or more selected channels of a frequency band and induced by analog-to-digital conversion, the method comprising:
   dynamically controlling a sample rate within an analog to digital conversion process that generates a digital data stream from analog signals in the frequency band, the sample rate controlled such that it is at least twice the frequency of an upper limit of the frequency band; and
   processing the digital data stream to determine the sample rate such that harmonics of a strong signal within the frequency band are outside the selected channels.

8. A method of claim 7, further comprising filtering radio signals within the frequency band.

9. An enhanced radio receiver, comprising:
   an analog to digital converter having a dynamically controllable sample rate, for generating a digital data stream from a frequency band of radio signals;

a channel demodulator for demodulating one or more selected channels within the frequency band;

a signal level indicator for measuring signal strengths at frequencies in the frequency band; and a sample rate calculator for controlling the sample rate in response to the digital data stream from the analog to digital converter such that harmonics of a strong signal within the frequency band are outside the selected channels.

10. An enhanced radio receiver system for reducing harmonic interference effects induced by analog-to-digital (A/D) conversion within one or more selected channels, comprising:

an analog circuitry stage having an output and an input configured to receive a first signal from an antenna, the analog circuitry stage operable to convert the first signal to a second signal at the output of the analog circuitry stage, the first signal having a wavelength corresponding to a Radio Frequency (RF) band that is detectable by the antenna, the second signal having a wavelength corresponding to an Intermediate Frequency (IF) band;

front end circuitry included in the analog circuitry stage, the front end circuitry coupled to the input of the analog circuitry stage and operable to receive the first signal and to generate a third signal in the RF band;

a frequency translator included in the analog circuitry stage, the frequency translator coupled to the output of the analog circuitry stage and operable to translate the third signal in the RF band to the second signal in the IF band;

a local oscillator (LO) included in the frequency translator, the LO operable to generate a fourth signal in the IF band;

a mixer included in the frequency translator, the mixer coupled to the front end circuitry and the LO, the mixer operable to mix the third signal in the RF band and the fourth signal in the IF band to produce a fifth signal having both RF band and IF band components;

a low pass filter included in the frequency translator and coupled to the mixer, the low pass filter operable to reject the RF band components of the fifth signal to produce the second signal in the IF band;

an A/D converter coupled to the output of the analog circuitry stage, the A/D converter operable to sample the second signal at a fixed sample rate to generate a digital data stream at an output of the A/D converter; and a signal processor coupled to the output of the A/D converter and to an input of the LO, the signal processor operable to process the digital data stream and further operable to control the frequency of the LO such that harmonics of a strong signal within the IF band are outside the selected channels.

11. An enhanced radio receiver system of claim 10, wherein the signal processor comprises a channel demodulator for demodulating the channels within the intermediate frequency band.

12. An enhanced radio receiver system of claim 11, wherein the signal processor comprises a signal level indicator for determining signal strengths at frequencies in the intermediate frequency band.

13. An enhanced radio receiver system of claim 11, wherein the signal processor comprises an oscillator frequency calculator for selecting the frequency of the dynamically controlled local oscillator by feedback with the frequency translator.

14. An enhanced radio receiver system of claim 10, further comprising means for inputting the selected channels to the signal processor.

15. A device comprising:

an antenna operable to detect radio signals in an input frequency band;

a local oscillator operable to generate a first signal having a first frequency in an intermediate frequency band at an output of the local oscillator;

a mixer coupled to the output of the local oscillator, the mixer operable to combine the first signal and a second signal to generate a third signal at an output of the mixer, the second signal including frequency components from the input frequency band;

a low-pass filter coupled to the output of the mixer, the low-pass filter operable to filter the third signal to generate a fourth signal in an intermediate frequency band;

an A/D converter coupled to an output of the low pass filter, the A/D converter operable to convert the fourth signal to a digital data stream at a fixed sample rate;

a channel demodulator for demodulating one or more selected channels within the digital data stream;

a channel level indicator for measuring signal strengths of frequencies in the intermediate frequency band; and a frequency calculator coupled to the channel level indicator and coupled to the local oscillator by a feedback path, the frequency calculator operable to dynamically control the first frequency of the first signal such that harmonics of a radio signal within the input frequency band are outside the one or more selected channels.

16. A method for reducing harmonic interference effects within one or more selected channels of a frequency band that are induced by Analog to Digital (A/D) conversion, the method comprising:

generating a digital data stream from analog signals in the frequency band using a current sampling rate, wherein the current sampling rate is at least twice the frequency of an upper limit of the frequency band;

determining whether harmonics of a strong signal within the frequency band exist within the selected channels at the current sampling rate; and dynamically adjusting the current sampling rate if the determining step identifies any harmonics within the selected channels.

\* \* \* \* \*